United States Patent
Aoki et al.

(10) Patent No.: US 10,692,829 B2
(45) Date of Patent: *Jun. 23, 2020

(54) METHOD OF FORMING A SOLDER BUMP STRUCTURE

(71) Applicant: INTERNATIONAL BUSINESS MACHINES CORPORATION, Armonk, NY (US)

(72) Inventors: Toyohiro Aoki, Kawasaki (JP); Takashi Hisada, Kawasaki (JP); Eiji I. Nakamura, Kawasaki (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/663,720

(22) Filed: Oct. 25, 2019

(65) Prior Publication Data
US 2020/0058612 A1    Feb. 20, 2020

Related U.S. Application Data

(60) Continuation of application No. 15/660,196, filed on Jul. 26, 2017, now Pat. No. 10,553,553, which is a
(Continued)

(51) Int. Cl.
*H01L 23/00* (2006.01)
*H01B 1/02* (2006.01)
(Continued)

(52) U.S. Cl.
CPC .............. *H01L 24/11* (2013.01); *H01B 1/026* (2013.01); *H01L 24/13* (2013.01); *H05K 3/4007* (2013.01);
(Continued)

(58) Field of Classification Search
CPC ......... H01L 24/11; H01L 24/13; H01L 24/05; H01B 1/026; H05K 3/4007; H05K 3/3478
(Continued)

(56) References Cited

U.S. PATENT DOCUMENTS 9,012,266 B2    4/2015   Nah et al.
2004/0238207 A1   12/2004   Nakamura et al.
(Continued)

FOREIGN PATENT DOCUMENTS

JP    2013138244    7/2013

OTHER PUBLICATIONS

Aoki, et al., "Characterization of Micro Bump Formed by Injection Molded Solder (IMS) Technology", IEEE Xplore Digital Library, Electronics Packaging (ICEP), 2014 International Conference on Apr. 2014, pp. 544-548.
(Continued)

*Primary Examiner* — Tremesha S Willis
(74) *Attorney, Agent, or Firm* — Tutunjian & Bitetto, P.C.; Vazken Alexanian (57) ABSTRACT

A solder bump structure includes a pillar formed on an electrode pad. The pillar has a concave curve-shaped surface and a geometry defined at least in part by dimensions including a first height greater than a first width. The solder bump structure further includes solder formed on the concave curve-shaped surface of the pillar. The solder has a convex top surface and having dimensions including a second height greater than a second width due to the geometry of the pillar.

20 Claims, 5 Drawing Sheets

Related U.S. Application Data division of application No. 15/254,759, filed on Sep. 1, 2016, now Pat. No. 9,859,241.

(51) Int. Cl.
*H05K 3/40* (2006.01)
*H05K 3/34* (2006.01)

(52) U.S. Cl.
CPC .... *H01L 24/05* (2013.01); *H01L 2224/03831* (2013.01); *H01L 2224/0401* (2013.01); *H01L 2224/05567* (2013.01); *H01L 2224/05624* (2013.01); *H01L 2224/1132* (2013.01); *H01L 2224/11312* (2013.01); *H01L 2224/11505* (2013.01); *H01L 2224/11622* (2013.01); *H01L 2224/13018* (2013.01); *H01L 2224/13076* (2013.01); *H01L 2224/13082* (2013.01); *H01L 2224/13109* (2013.01); *H01L 2224/13111* (2013.01); *H01L 2224/13113* (2013.01); *H01L 2224/13339* (2013.01); *H01L 2224/13344* (2013.01); *H01L 2224/13347* (2013.01); *H01L 2224/13355* (2013.01); *H01L 2224/94* (2013.01); *H05K 3/3478* (2013.01); *H05K 2201/10734* (2013.01)

(58) Field of Classification Search
USPC ........................................................ 174/261
See application file for complete search history.

(56) References Cited

U.S. PATENT DOCUMENTS

| 2009/0181223 A1 | 7/2009 | Buchwalter et al. |
| 2014/0145343 A1 | 5/2014 | Kim et al. |
| 2016/0113144 A1 | 4/2016 | Ye et al. |
| 2016/0118358 A1 | 4/2016 | Dang et al. |

OTHER PUBLICATIONS

Gruber, et al., "Low-cost Wafer Bumping", IEEE Xplore Digital Library, IBM Journal of Research and Development, pp. 621-639, Jul. 2005.

Kobata et al., "Development Status of Photoresist as Mask Material for Injection Molded Solder (IMS) Technique", 2016 Pan Pacific Microelectronics Symposium (Pan Pacific), Jan. 2016, pp. 1-6.

Nah, et al., "Wafer IMS (Injection Molded Solder)—A New Fine Pitch Solder Bumping Technology on Wafers With Solder Alloy Composition Flexibility", 2014 IEEE 64th Electronic Components and Technology Conference, May 2014, pp. 1308-1313.

U.S. Office Action issued in U.S. Appl. No. 15/803,053, dated May 3, 2018, pp. 1-20.

U.S. Office Action issued in U.S. Appl. No. 15/803,053 dated Nov. 26, 2018, 19 pages.

U.S. Office Action issued in U.S. Appl. No. 15/803,053, dated Jul. 25, 2019, pp. 1-16.

List of IBM Patents or Patent Applications Treated as Related dated Oct. 25, 2019, 2 pages.

METHOD OF FORMING A SOLDER BUMP STRUCTURE

BACKGROUND OF THE INVENTION

Technical Field

The present invention relates to a method of forming a solder bump structure, and more specifically, to a method of forming a solder bump structure using metal paste and molten solder.

Description of the Related Art

While performance and function of electronics devices improve highly, the flip chip packaging is broadly applied from the consumer product represented by a smart phone, tablet PC, etc. to the supercomputer. Furthermore, it is predicted that the demand of the flip chip packaging increases sharply by the appearance of the 2.5 or 3-dimensional (2.5D or 3D) stacked device of the semiconductor chip.

In the 2.5D or 3D package, connecting terminals pitch and bump size is dramatically fine. In that case, there is a problem of failure due to stress applied to the junction or failure due to electro migration (EM) caused by the increase of current density. To solve this problem, the solder bumps using Cu pillars corresponding to the miniaturization of the connecting terminals pitch and bump size is mainly used.

Since Cu Pillar is generally formed using electroplating, there is a need for formation and removal (etching) of the seed layer. Therefore, the production cost is relatively high. Further, there is also the use of electroless plating to form the electrode pads under the solder bumps. However, the electroless plating is difficult to process manage.

Thus, the formation of the conventional solder bumps needs electroplating/electroless plating, which has a high process cost and difficult process management. Therefore, there is need to form fine solder bumps without using the plating process.

SUMMARY OF THE INVENTION

One embodiment of the present invention provides a method of forming a solder bump structure without using a plating process. In the method, conductive paste injected in opening of the resist layer is sintered and contracted to form metal pillar (conductive layer) connected to the electrode pad underneath.

Each of the formed metal pillars (conductive layer) has cone-shaped surface. The cone-shaped surface covers the sidewalls of the openings of the resist layer, and extends upwardly to the entrance opening. Therefore, the contact area with solder formed thereon increases. Furthermore, it is possible to prevent the gas out from the sidewalls of the resist layer during solder melting (bonding) and the occurrence of incomplete solder fill.

Another embodiment of the present invention provides a solder bump structure. The solder bump structure includes a pillar formed on an electrode pad. The pillar has a concave curve-shaped surface and a geometry defined at least in part by dimensions including a first height greater than a first width. The solder bump structure further includes solder formed on the concave curve-shaped surface of the pillar. The solder has a convex top surface and having dimensions including a second height greater than a second width due to the geometry of the pillar.

Yet another embodiment of the present invention provides a solder bump structure. The solder bump structure includes a resist layer including an opening, and a pillar formed on an electrode pad and in the opening of the resist layer. The pillar has a concave curve-shaped surface and a geometry defined at least in part by dimensions including a first height greater than a first width. The solder bump structure further includes solder formed on the concave curve-shaped surface of the pillar. The solder has a convex top surface and having dimensions including a second height greater than a second width due to the geometry of the pillar.

Yet another embodiment of the present invention provides a circuit board. The circuit board includes a plurality of electrode pads on a substrate, and a plurality of pillars formed on respective ones of the plurality of electrode pads. The plurality of pillars each have a concave curve-shaped surface and a geometry defined at least in part by dimensions including a first height greater than a first width. The circuit board further includes solder formed on the concave curve-shaped surfaces of the plurality of pillars. The solder has a non-spherical shape with a convex top surface and having dimensions including a second height greater than a second width due to the geometry of the plurality of pillars.

DETAILED DESCRIPTION

Figure 1:
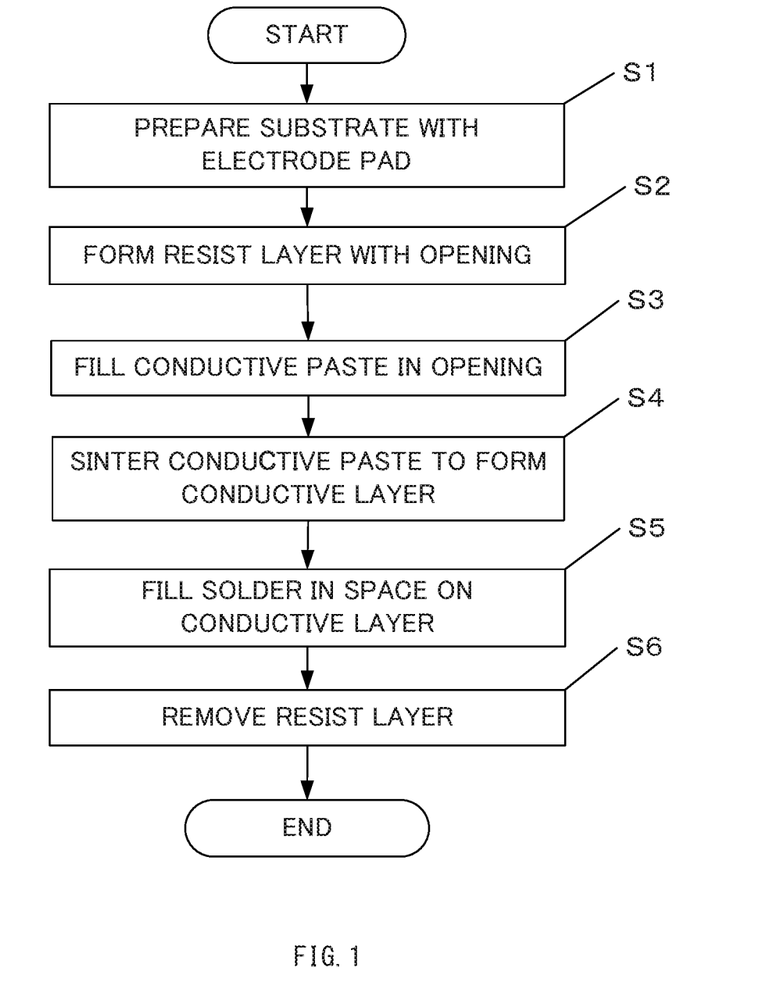
FIG. 1 is a chart showing a flow of one embodiment of the method of the present invention.
Figure 8:
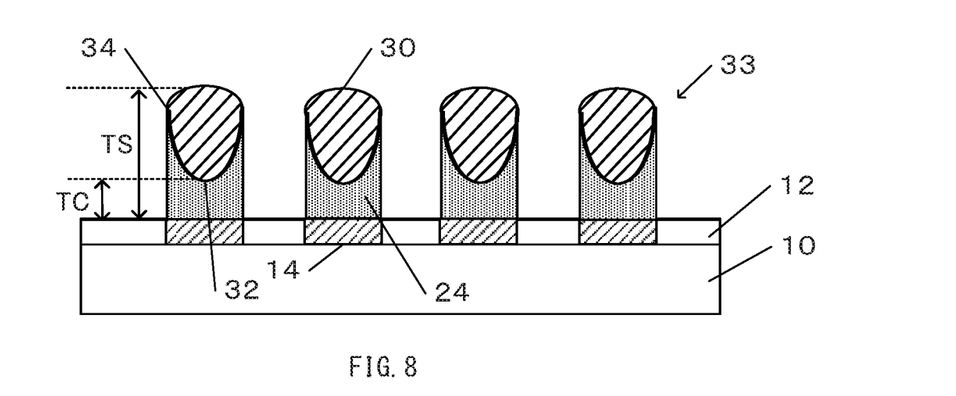
FIG. 8 is a cross-sectional diagram showing each step in the flow of one embodiment of the method of the present invention.
Figure 9:
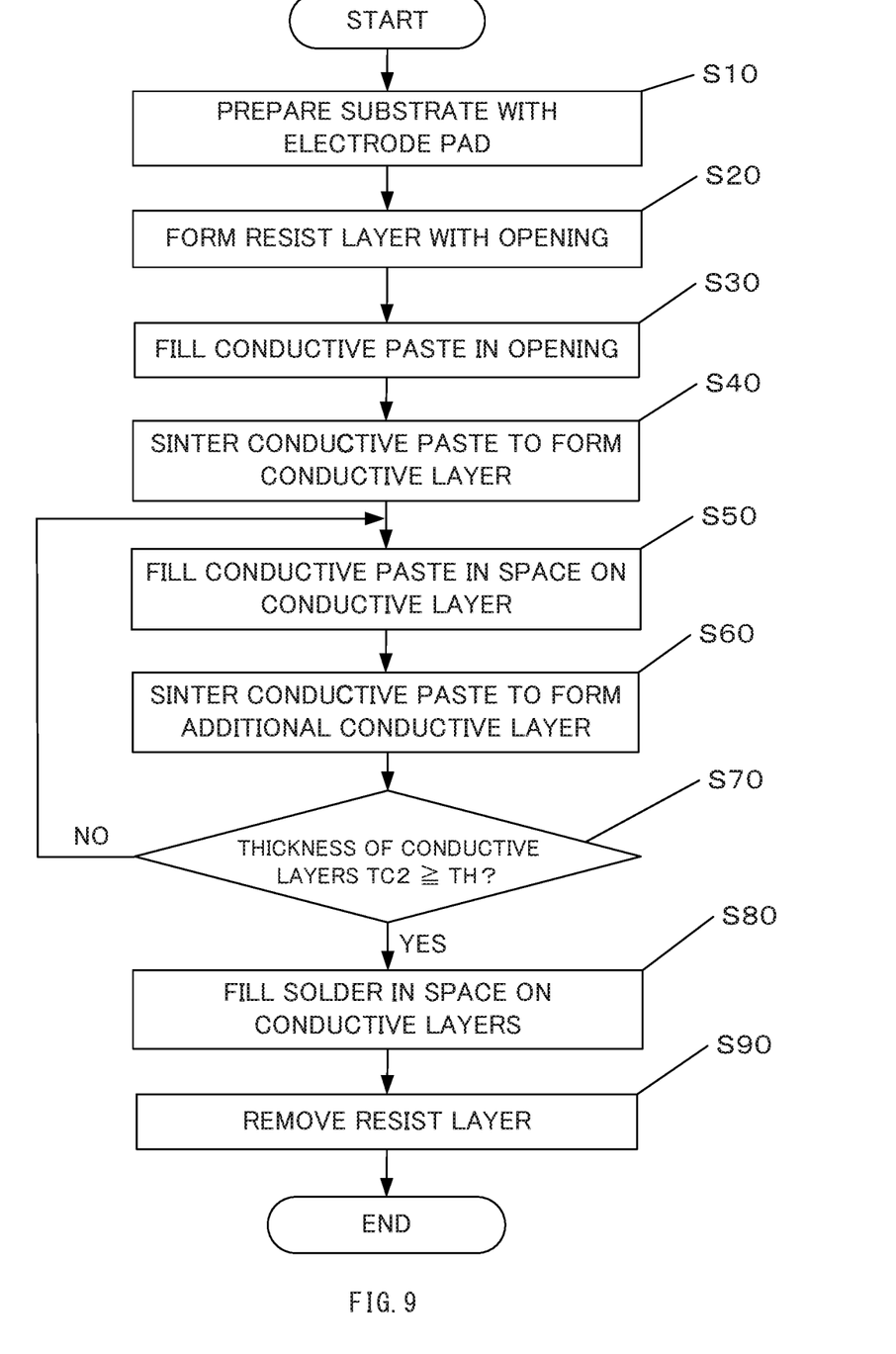
FIG. 9 is a chart showing a flow of another embodiment of the method of the present invention.
Figure 10:
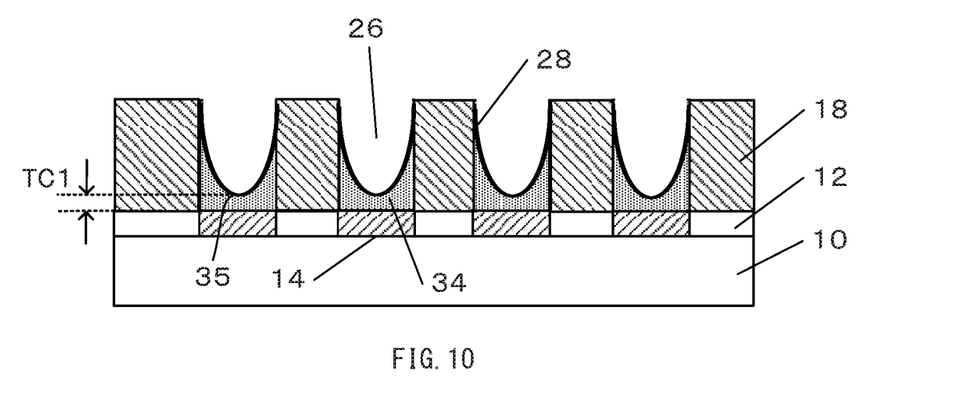
FIG. 10 is a cross-sectional diagram showing each step in the flow of one embodiment of the method of the present invention.
Figure 11:
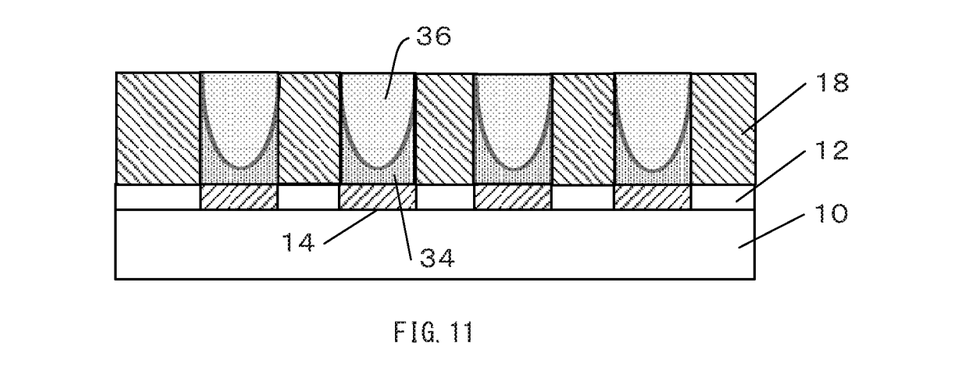
FIG. 11 is a cross-sectional diagram showing each step in the flow of one embodiment of the method of the present invention.
Figure 12:
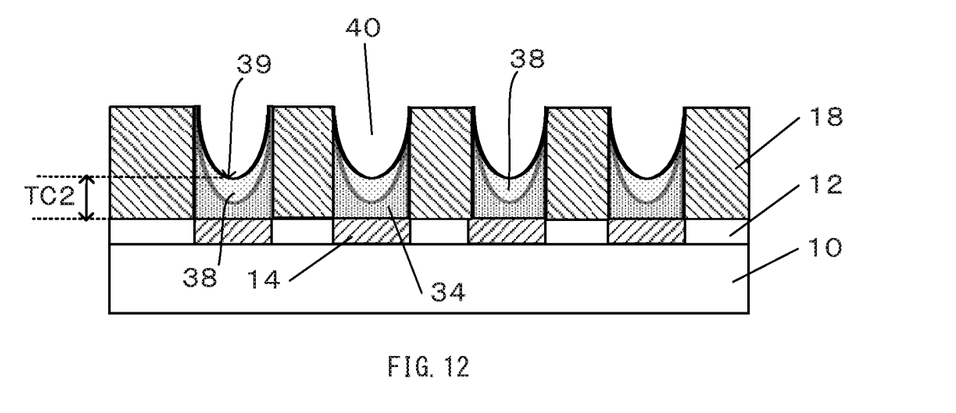
FIG. 12 is a cross-sectional diagram showing each step in the flow of one embodiment of the method of the present invention.

The following is an explanation of embodiments of the present invention with reference to the drawings. FIG. 1 is a chart showing a flow of one embodiment of the method of the present invention. Each of FIG. 2 to FIG. 8 shows cross-sectional diagram at each step in the flowchart of FIG. 1. FIG. 9 is a chart showing a flow of another embodiment of the method of the present invention. FIG. 10 to FIG. 12 show cross-sectional diagrams at three steps selected from the flowchart of FIG. 9. Each of the cross-sectional diagrams shows a part of a substrate. The following is an explanation of the embodiments of the method of the present invention with reference to FIG. 1 to FIG. 12.

Embodiment 1

Figure 2:
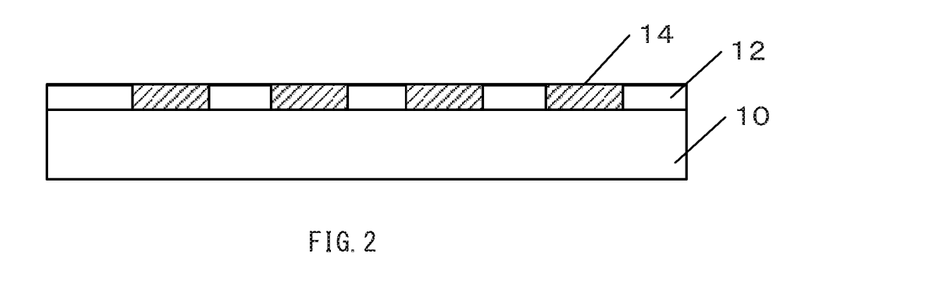
FIG. 2 is a cross-sectional diagram showing each step in the flow of one embodiment of the method of the present invention.

Referring FIG. 1 and FIG. 2, in step S1, a substrate 10 is prepared first. The substrate 10 has a surface on which electrode pads 14 have been formed between patterned insulating layers 12. The electrode pads 14 can include metal such as Aluminum (Al), for example. The insulating layers 12 can include silicon oxide ($SiO_2$), for example. The substrate 10 can include semiconductor wafer such as a Si wafer, a semiconductor chip/die, or a circuit board. The material of the semiconductor wafer or chip is not limited to specific types. The substrate 10 can include a plurality of wiring layers (including circuits, devices such as a transistor) and insulating layers. The wiring layers can be electrically connected to the electrode pads 14. The substrate 10 may include the lamination (stack) of a plurality of semiconductor substrates.

Figure 3:
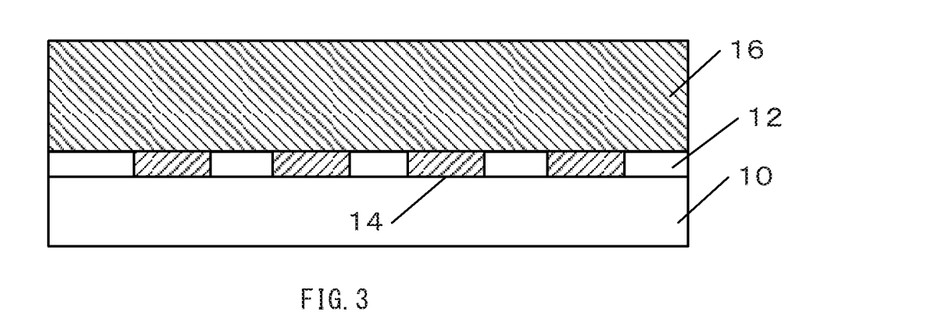
FIG. 3 is a cross-sectional diagram showing each step in the flow of one embodiment of the method of the present invention.

Referring FIG. 3, in step S2, a resist layer 16 is formed on the substrate 10 as shown in FIG. 3. A resist material is applied on the substrate 10 using spin coating for example, and the resist material is cured at a predetermined temperature to form the resist layer 16. The resist material may include light (UV)-curable resin (photopolymer) or thermosetting resin (polymer). The resist layer 16 may include one of negative type resist or positive type resist.

Figure 4:
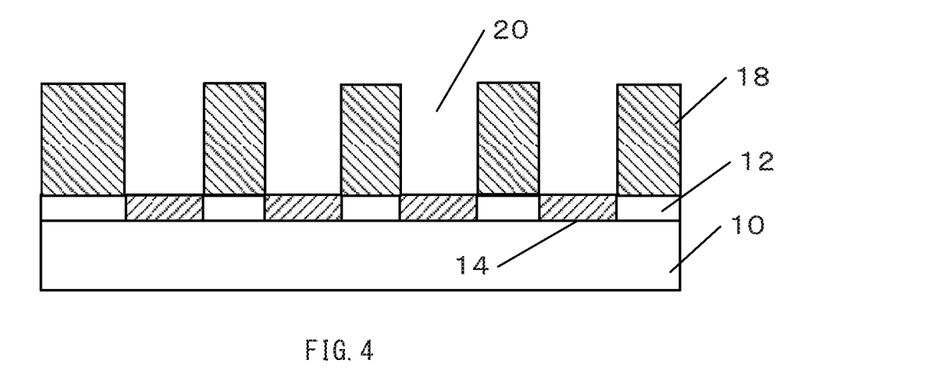
FIG. 4 is a cross-sectional diagram showing each step in the flow of one embodiment of the method of the present invention.

Next, the resist layer 16 is exposed using light induced through a photo mask (not shown) in FIG. 3. The exposure is performed to expose only the resist region over the insulating layers 14 without exposing the resist region over the electrode pads 14. Next, the exposed resist layer 16 is developed, and openings including an opening 20 are formed over the electrode pads 14 as shown in FIG. 4. The opening 20 exposes the surface of the electrode pad 14 on the substrate 10. When the electrode pad 14 is formed of a metal easily oxidized such as Al, it is necessary to remove the oxide layer formed on the surface before the next step. The oxide layer can be removed by etching using an acidic solution, for example.

Figure 5:
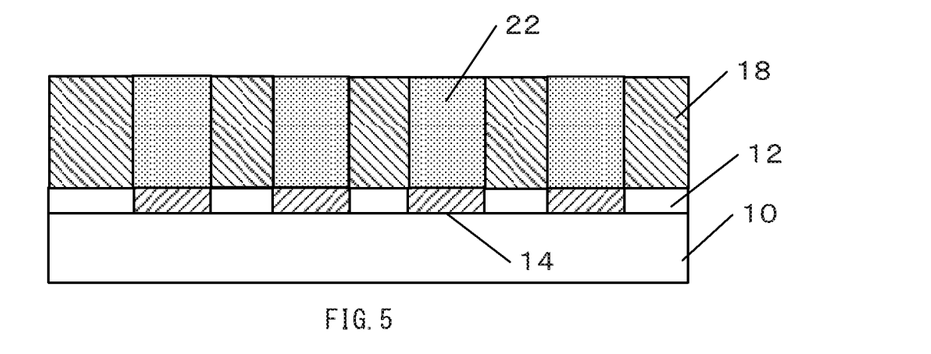
FIG. 5 is a cross-sectional diagram showing each step in the flow of one embodiment of the method of the present invention.

Next, in step S3, conductive paste 22 is filled in the opening 20 of the resist layer 18 as shown in FIG. 5. The conductive paste 22 can be filled in the opening 20 of the resist layer 18 using screen-printing technique or injecting technique, for example. The conductive paste 22 can include metal nanoparticles in a solvent. The metal nanoparticles can include at least one of copper (Cu), nickel (Ni), silver (Ag) or gold (Au), for example. The viscosity of the paste and the particle fraction in the paste can be determined in consideration of paste shrinkage, in other words, the thickness of a conductive layer to be obtained by sintering of the next process.

Figure 6:
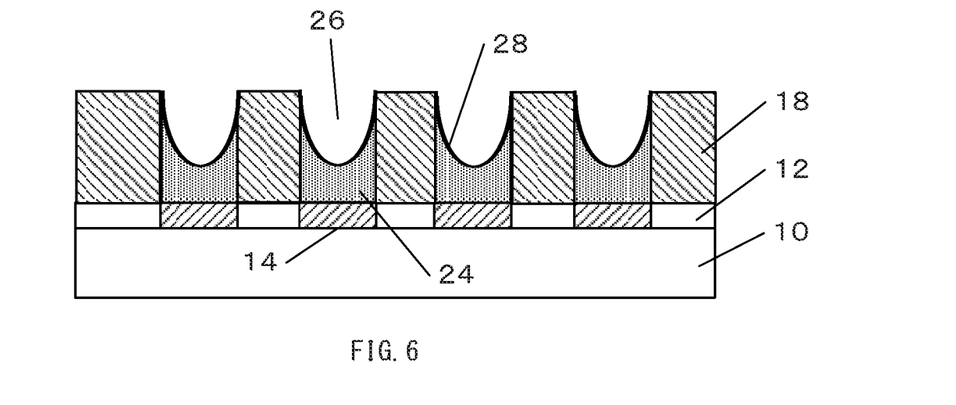
FIG. 6 is a cross-sectional diagram showing each step in the flow of one embodiment of the method of the present invention.

Next, in step S4, the conductive paste 22 in the opening 20 is sintered to form a conductive layer. The sintering of the conductive paste 22 in the opening is performed to heat the conductive paste 22 at 100 to 250 degrees for 0.1 to 2.0 hours in an atmosphere of nitrogen gas or formic acid to prevent oxidation of the metal surface after the sintering. If the sintering is performed in air, it is necessary to remove the oxide layer on the metal surface. In the sintering process, the conductive paste 22 is shrunk so that the conductive layer 24 is formed to cover the side wall of the resist layer 18 and the surface of the electrode pad 14 in the opening 20 as shown in FIG. 6. As solder filling is performed in the next step without additional conductive paste coating, the volume shrinkage of the conductive paste 22 after sintering is optimized. The volume shrinkage of the conductive paste 22 is dependent on the design value of the bump diameter/height, and for example is preferably 50% or more. The conductive layer 24 corresponds to a conventional metal pillar (post). The space 26 is formed on the conductive layer 24 which leads to the upper end of the opening 20. The conductive layer 24 has a cone-shaped surface 28 shown in FIG. 6. The cross-section of the conductive layer 24 has a conformal shape.

Figure 7:
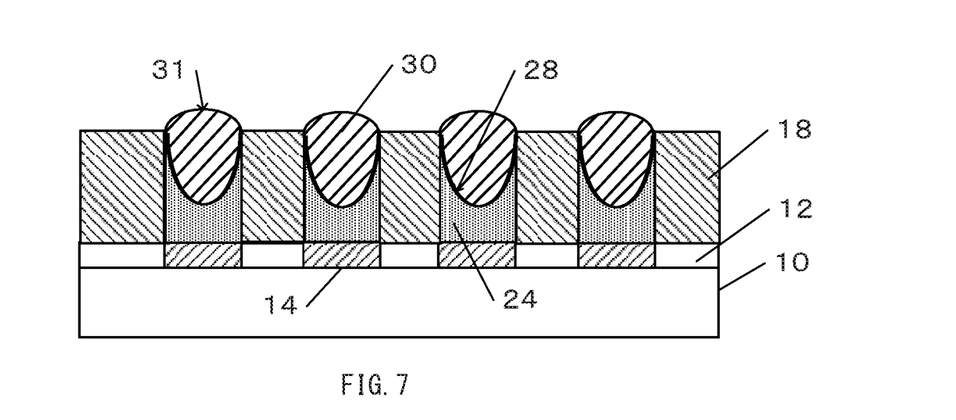
FIG. 7 is a cross-sectional diagram showing each step in the flow of one embodiment of the method of the present invention.

Next, in step S5, solder 30 is filled in the space 26 on the conductive layer 24 as shown in FIG. 7. The solder bump structure of FIG. 7 can be used as an embodiment of the present invention. This embodiment can be used for flip-chip bonding after the substrate 10 was divided into a plurality of chips. The solder 30 is injected in the space 26 on the conductive layer 24 using Injection Molded Solder (IMS) process, for example. In the IMS, molten solder is filled in the space under a predetermined pressure. The solder may include a Pb-free solder metal containing at least one metal selected from the group consisting of elemental Sn, Ag, Au, Cu, Ni, Bi, In, Zn, Co, Ge, Fe and Ti, and containing Sn, Bi or In as a main component. The solder 30 has a convex top surface 31. Next, in step S6, the resist layer 18 is removed using etching process and the solder bump structure 33 of the one embodiment of the present invention is formed as shown in FIG. 8. As described above, it may also be used in an embodiment shown in FIG. 7 without removing the resist layer 18.

In the solder bump structure 33, the thickness TC of the central portion 32 of the conductive layer (metal pillar) 24 is in the range of $1/5$ to $2/3$ of the length TS from the surface of the electrode pad 14 to the top surface of the solder 31. The thickness TC of the central portion 32 of the metal pillar 24 is in the range of 1 to 50 micrometers. After the sintering of the conductive paste 22, the conductive layer 24 is formed on the side wall of the resist layer 18 as described above referring to FIG. 6. Therefore, it expected to improvement of solder wet-ability and solder filling property. Further, in the EM (Electro migration) test, the initial void is easily generated in the periphery of the metal pillar and the electrode pad. However, since the conductive layer 24 on the side wall of the resist layer 18 is formed, it is expected to improve the EM resistance.

Embodiment 2

Referring FIG. 9 to FIG. 12, another embodiment of the method of the present invention is explained. Steps S10 to S40 in FIG. 9 are same as steps S1 to S4 in FIG. 1 as described above. Steps 50 to 70 are added as new steps in FIG. 9. FIG. 10 shows a cross-sectional diagram after step S40 which performs sintering of the conductive paste 22 in the opening 20 in FIG. 5. In FIG. 10, a thin conductive layer 34 is formed after the sintering process. The thin conductive layer 34 covers the side wall of the resist layer 18 and the surface of the electrode pad 14 in the opening 20 as shown in FIG. 10. The thickness TC1 of the central portion 35 of the conductive layer 34 is thinner than the predetermined thickness in the range of 1 to 50 micrometers, for example.

Therefore, it is necessary to form additional conductive layers on the conductive layer 34 in order to ensure a predetermined thickness.

In step S50, additional conductive paste 36 is filled in the opening 26 of the resist layer 18 as shown in FIG. 11. The filling of the conductive paste 36 is performed to the upper surface of the opening 26 as step S3 in FIG. 3 described above. In step S60, additional sintering of the conductive paste 36 is performed to form the additional conductive layer 38 on the conductive layer 34 as shown in FIG. 12. In step S70, it is judged whether the total thickness TC2 of the central portion 39 (35) of the conductive layers 34, 38 is over the predetermined thickness TH or not. If the thickness TC2 is smaller than the predetermined thickness TH, step S50 and S60 are repeated until the thickness TC2 is equal to or greater than the predetermined thickness TH.

If the judgment of step S70 is YES, in step S80, solder 30 is filled in the space 40 on the conductive layer 38 as in the case of FIG. 7. The solder 30 is injected in the space 40 on the conductive layer 38 using IMS process, for example. Finally, in step S90, the resist layer 18 is removed using etching process and the solder bump structure of another embodiment of the present invention is formed as in the case of FIG. 8. This embodiment is characterized in that the conductive layer is formed of two or more layers as shown in FIG. 12 in order to obtain the predetermined thickness of the central portion 39 of the conductive layers 34, 38.

Embodiment 3

Referring FIG. 1, FIG. 5, and FIG. 7, another embodiment of the method of the present invention is explained. In this embodiment, the filling of the conductive paste 22 in step S3 of FIG. 1 and FIG. 5 is performed using IMS process which is used in step S5 of filling of solder 30 instead of screen printing. In step S3, the conductive paste 22 is injected in place of solder under predetermined pressure by IMS process. By using the IMS in Step S3, it is possible to perform steps S3 to Step S5 under one IMS process. That is, even sintering of step S4 can be performed in the IMS process. As a result, it is possible to achieve a further shortening of the production time and simplification of the manufacturing process to form the solder bump structure.

The embodiment of the present invention has been described with reference to the accompanying drawings. However, the present invention is not limited to the embodiment. The present invention can be carried out in forms to which various improvements, corrections, and modifications are added based on the knowledge of those skilled in the art without departing from the purpose of the present invention.

The invention claimed is:

1. A solder bump structure comprising:
    a pillar formed on an electrode pad, the pillar having a concave curve-shaped surface and a geometry defined at least in part by dimensions including a first height greater than a first width; and
    solder formed on the concave curve-shaped surface of the pillar, the solder having a convex top surface and having dimensions including a second height greater than a second width due to the geometry of the pillar.
2. The solder bump structure according to claim 1, wherein the solder is in contact with an entirety of the curve-shaped surface of the pillar.
3. The solder bump structure according to claim 1, wherein the pillar includes at least one material selected from the group consisting of: copper, nickel, silver and gold.
4. The solder bump structure according to claim 1, wherein a thickness of a central portion of the pillar is in a range of ⅕ to ⅔ of a length from a surface of the electrode pad to the convex top surface of the solder.
5. The solder bump structure according to claim 4, wherein the electrode pad includes aluminum.
6. The solder bump structure according to claim 1, wherein a thickness of a central portion of the pillar is in a range of 1 to 50 micrometers.
7. The solder bump structure according to claim 1, wherein the solder has a non-spherical shape.
8. A solder bump structure comprising:
    a resist layer including an opening;
    a pillar formed on an electrode pad and in the opening of the resist layer, the pillar having a concave curve-shaped surface and a geometry defined at least in part by dimensions including a first height greater than a first width; and
    solder formed on the concave curve-shaped surface of the pillar, the solder having a convex top surface and having dimensions including a second height greater than a second width due to the geometry of the pillar.
9. The solder bump structure according to claim 8, wherein the solder is in contact with an entirety of the curve-shaped surface of the pillar.
10. The solder bump structure according to claim 8, wherein the pillar includes at least one material selected from the group consisting of: copper, nickel, silver and gold.
11. The solder bump structure according to claim 8, wherein a thickness of a central portion of the pillar is in a range of ⅕ to ⅔ of a length from a surface of the electrode pad to the convex top surface of the solder.
12. The solder bump structure according to claim 8, wherein a thickness of a central portion of the pillar is in a range of 1 to 50 micrometers.
13. The solder bump structure according to claim 8, wherein the electrode pad includes aluminum.
14. The solder bump structure according to claim 8, wherein the solder has a non-spherical shape.
15. A circuit board which has two or more solder bumps comprising:
    a plurality of electrode pads on a substrate;
    a plurality of pillars formed on respective ones of the plurality of electrode pads, the plurality of pillars each having a concave curve-shaped surface and a geometry defined at least in part by dimensions including a first height greater than a first width; and
    solder formed on the concave curve-shaped surface of the plurality of pillars, the solder having a non-spherical shape with a convex top surface and having dimensions including a second height greater than a second width due to the geometry of the plurality of pillars.
16. The circuit board according to claim 15, wherein the solder is in contact with an entirety of the curve-shaped surface of the plurality of pillars.
17. The circuit board according to claim 15, wherein the plurality of pillars each includes at least one material selected from the group consisting of: copper, nickel, silver and gold.
18. The circuit board according to claim 15, wherein a thickness of a central portion of each of the plurality of pillars is in a range of ⅕ to ⅔ of a length from a surface of the electrode pad to the convex top surface of the solder.
19. The circuit board according to claim 15, wherein a thickness of a central portion of each of the plurality of pillars is in a range of 1 to 50 micrometers.

20. The circuit board according to claim 15, wherein each of the plurality of electrode pads includes aluminum.

\* \* \* \* \*